US 6,924,156 B2

(12) United States Patent
Zhuang et al.

(10) Patent No.: US 6,924,156 B2
(45) Date of Patent: Aug. 2, 2005

(54) METHOD FOR FORMING A FERROELECTRIC CAPACITOR DEVICE

(75) Inventors: Haoren Zhuang, Tokyo-to (JP); Ulrich Egger, Kanagawa-ken (JP)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/676,360

(22) Filed: Sep. 30, 2003

(65) Prior Publication Data

US 2005/0067643 A1 Mar. 31, 2005

(51) Int. Cl.$^7$ .............................................. H01L 21/00
(52) U.S. Cl. ........................................ 438/3; 438/240
(58) Field of Search ............................ 438/3, 240, 241, 438/713, 258, 275, 720, 735

(56) References Cited

U.S. PATENT DOCUMENTS

| 5,972,722 | A | 10/1999 | Visokay et al. |
| 6,207,496 | B1 * | 3/2001 | Kang .......................... 438/253 |
| 6,211,034 | B1 | 4/2001 | Visokay et al. |
| 6,465,321 | B1 | 10/2002 | Shin et al. |
| 6,762,064 | B1 * | 7/2004 | Zhuang et al. .................. 438/3 |
| 6,780,708 | B1 * | 8/2004 | Kinoshita et al. ............ 438/241 |
| 2003/0082916 | A1 | 5/2003 | Chung et al. |
| 2003/0119251 | A1 | 6/2003 | Aggarwal et al. |

OTHER PUBLICATIONS

"Sputter–Resistant Mask Structure and Process", IBM Technical Disclosure Bulletin, IBM Corp., New York, USA, 33(3B):379–381, Aug. 1990.

* cited by examiner

*Primary Examiner*—David Nelms
*Assistant Examiner*—Thinh T. Nguyen
(74) *Attorney, Agent, or Firm*—Fish & Richardson P.C.

(57) ABSTRACT

A ferroelectric capacitor device, such as an FeRAM device is formed by forming a substrate extending in a first plane and comprising a number of layers of material, forming a hard mask layer on the substrate and forming a first layer of a first material on the hard mask layer. The hard mask shape is then defined by etching the hard mask layer. A second layer of the first material is deposited on the etched hard mask layer. The deposited second layer has one or more side surfaces extending substantially perpendicular to the plane of the substrate. The second layer and the number of layers forming the substrate are then etched to shape the ferroelectric capacitor device.

13 Claims, 6 Drawing Sheets

After Hard Mask Open
(Initial HM angle reducing because of side etching)

During Cell RIE
(HM angle further reduce because of side etching)

Before main etching
(hard mask with a "hard shell", vertical shape)

During main etching
(hard mask shape not change because of the shell)

Before hard mask open

After hard mask open

Additional hard material deposit
(Before main etching)

Before hard mask open

Before etching material B

Before material B deposit

After material B deposit

METHOD FOR FORMING A FERROELECTRIC CAPACITOR DEVICE

FIELD OF THE INVENTION

The present invention relates to a device such as a ferroelectric capacitor device and a method for forming a ferroelectric capacitor device.

BACKGROUND OF THE INVENTION

A conventional ferroelectric capacitor includes one or more ferroelectric layers sandwiched between a bottom electrode and a top electrode. The ferroelectric layer(s) may include, for example, PZT, SBT or BLT. The capacitor is covered with one or more interlayer dielectric layers, normally Tetraethyl Orthosilicate (TEOS), and connection to the top electrode is achieved by etching a window through the interlayer dielectric layer(s) and filling the window with a metal filler. The bottom electrode is mounted on a substrate, the electrical connection to the bottom electrode typically being via a metal plug through the substrate. To make the connection between the bottom electrode and the plug, a window is formed through the interlayer dielectric layer(s), through the other layers of the capacitor and into the plug. A liner is formed in this window and a metal filler is deposited in the bottom of the window to make the contact between the bottom electrode and the plug. The liner and the metal filler are etched to leave just the contact to the plug. Encapsulation layers and cover layers are added to protect the resultant capacitor.

In the production of conventional capacitors it is necessary to etch the top and bottom electrodes in separate processes, and, in each case, a hard mask is used to define the etch pattern. Thus, vertical etching, that is etching down from the top layer of the device towards the substrate is a fundamental process in the manufacture of capacitor devices, such as FeRAMs. To obtain an accurate etch, the sides of the hard mask used to define the etching process should be, as near as possible, normal to the surface being etched, both when making the mask and when using the mask to etch the main cell material of the capacitor.

During the etching processes, for example, to open the hard mask (that is, to shape the hard mask material) and to etch the actual device according to the hard mask, the top of the aperture or "cut" formed whilst etching is exposed to the etching process for longer than the bottom of the aperture. Thus, more material is removed from the top of the aperture than the bottom, resulting in the aperture tapering from top to bottom, the aperture being wider at the top than at the bottom. The angle between the substrate and the etched side of the hard mask is termed the hard mask angle.

Typically, the hard mask material is TEOS. It is difficult to obtain anything approaching a 90 degree hard mask angle when etching such a material. Furthermore, when using the mask to define the etching of the remaining layers, the mask etches further, for example during the applied RIE process, thereby accentuating the problem. Although side etching, that is etching along the mask rather than through the mask, is not extensive during these processes, TEOS is a soft material for most stages in the RIE process and thus any side etching is noticeable and significant.

In view of the foregoing problems with conventional processes and devices, a need exists for an easily applied method for producing capacitors with minimal tapering of the etch apertures, without reducing production yield or compromising performance.

SUMMARY OF THE INVENTION

In general terms, the present invention proposes the deposition of an additional layer of material over the hard mask material in the formation of a ferroelectric capacitor, after the hard mask material has been pattern-etched.

The additional layer of material is one not easily etched by processes involved in etching the main cell materials of the capacitor. As a result, it is substantially unaffected by side etching. The main purpose of this additional layer of material is to remove the taper of the etch apertures so that the sides of the mask are substantially normal to the surfaces of the main cell material to be etched through the hard mask. This will improve the etching of the main cell materials so that the etched faces are substantially normal to the substrate. Furthermore, this reduction in side etching allows the capacitors to be placed closer together which improves the packing density and the accuracy of the main cell material etching process.

In a further preferred embodiment, an extra layer of hard mask material may be deposited over the additional layer of material described above and before the photolithographic mask is applied. This is advantageous in situations where the photolithographic material will not withstand the etching process used to open the additional layer of material.

The methods of the present invention are easily performed and the devices embodying the present invention are easily created.

According to a first aspect of the present invention there is provided a method for forming a ferroelectric capacitor device comprising the steps of:

forming a substrate extending in a first plane and comprising a number of layers of material:

forming a hard mask layer on said substrate;

forming a first layer of a first material on said hard mask layer;

defining a hard mask shape by etching said hard mask layer;

depositing a second layer of said first material on said etched hard mask layer, said deposited second layer having one or more side surfaces extending substantially perpendicular to said plane of said substrate;

etching said second layer and said number of layers forming said substrate to shape said ferroelectric capacitor device.

According to a second aspect of the present invention there is provided a ferroelectric capacitor device formed according to the above method.

According to a third aspect of the present invention there is provided an FeRAM device formed according to the above method.

According to a fourth aspect of the present invention there is provided a device comprising:

a substrate extending in a first plane and comprising a number of layers of material;

a first layer of hard mask material formed on said substrate;

a first layer of a first material formed on said first layer of hard mask material, said first layer of hard mask material being etched to define said hard mask; and a second layer of said first material deposited on said etched layer of hard mask material, said deposited second layer having one or more side surfaces extending substantially perpendicular to said plane of said substrate.

According to a fifth aspect of the present invention there is provided a ferroelectric capacitor device comprising one or more of the above-defined devices.

According to a sixth aspect of the present invention there is provided an FeRAM device comprising one or more of the above-defined devices.

BRIEF DESCRIPTION OF THE DRAWINGS

Preferred features of the invention will now be described, for the sake of illustration only, with reference to the following Figures in which.

DETAILED DESCRIPTION OF PREFERRED EMBODIMENTS

Figure 1:
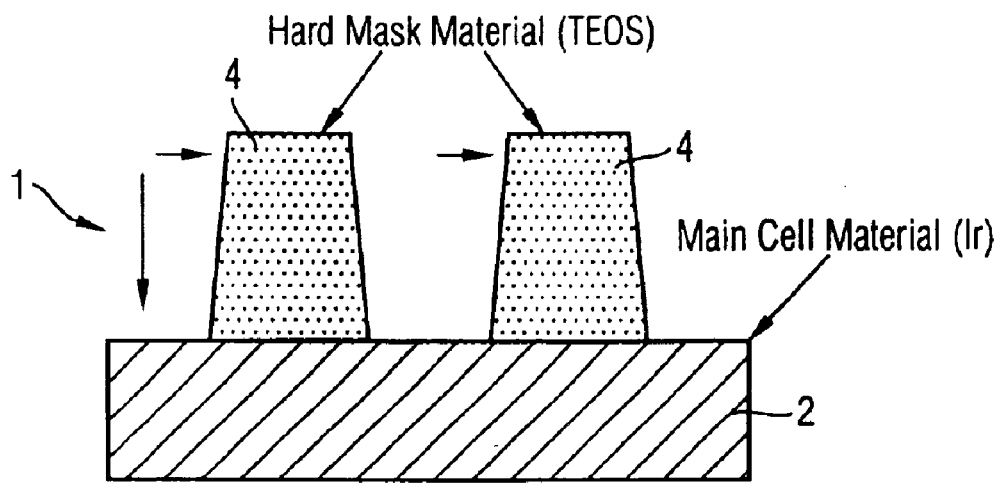
FIG. 1 is a schematic cross-section of a conventional FeRAM after the hard mask has been opened.
Figure 2:
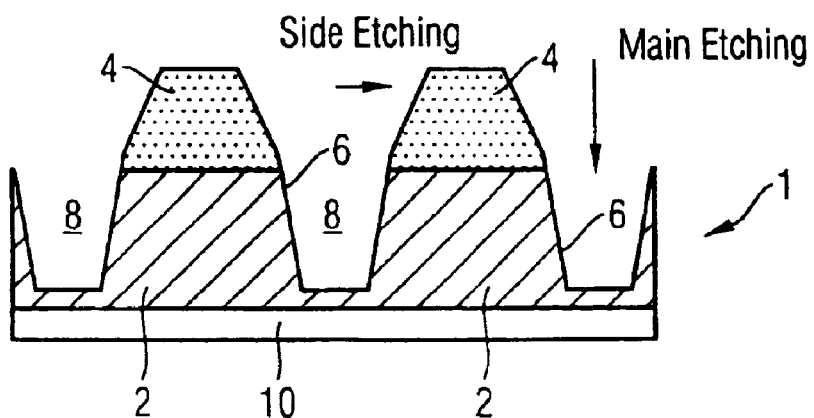
FIG. 2 is a schematic cross-section of a conventional FeRAM during an RIE of the main cell material.

FIGS. 1 and 2 show a conventional FeRAM capacitor device 1 and the changes in the shape of the hard mask during hard mask opening and main cell etching.

In FIG. 1 the device 1 is represented by the main cell material 2 onto which is deposited the hard mask material 4. The hard mask material 4, which may be TEOS, is etched to open the mask, as shown in FIG. 1. The sides of the hard mask-material 4 are not vertical but taper due to side etching, that is etching along the mask rather than through the mask.

FIG. 2 shows the conventional FeRAM of FIG. 1 during etching of the main cell material 2. The hard mask material 4 is tapering at a greater angle than in FIG. 1 due to side etching. The side faces 6 of the etched main cell material 2 defining the apertures 8 created by the etching process are also inclined from the normal to the substrate 10, partly due to side etching and partly due to the taper of the hard mask material 4.

The methods and devices which illustrate preferred embodiments of the invention will be explained with reference to FIGS. 3a to 10. The elements of the FeRAM capacitor structure illustrated in FIGS. 1 and 2 which correspond exactly to elements in the FeRAM capacitors shown in FIGS. 3a to 10 are allotted the same reference numerals.

Figure 3A:
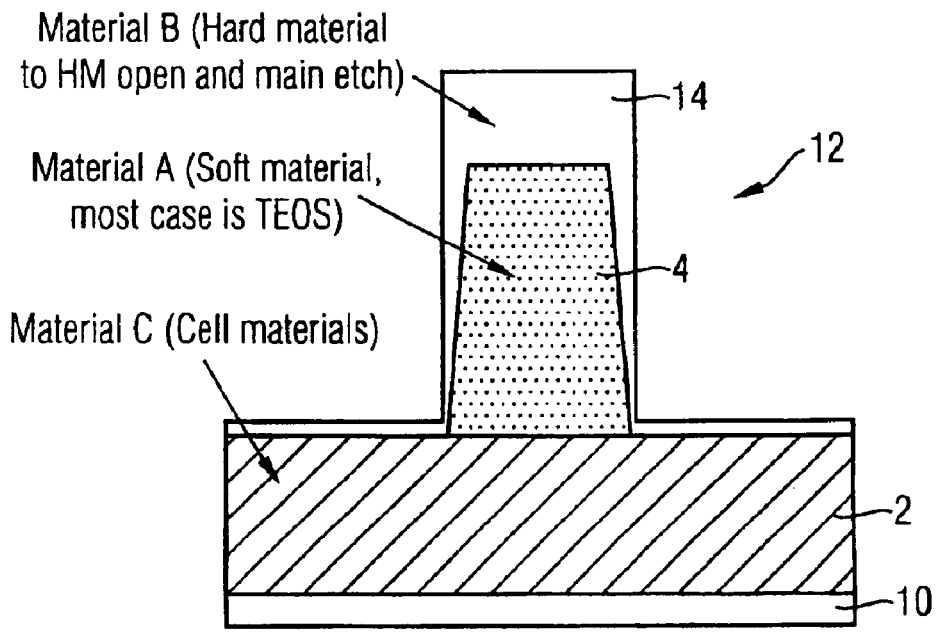
FIG. 3a is a schematic cross-section of an FeRAM according to an embodiment of the invention before main etching.

FIG. 3a shows an FeRAM capacitor structure 12 according to a first embodiment of the present invention in which the hard mask material 4 deposited on the main cell material 2 has been etched as in FIG. 1, and a further layer of hard material 14 has been deposited over the etched hard mask and the exposed surfaces of the main call material 2. The material used as the hard material layer 14 will depend on the main cell materials to be etched. In a preferred embodiment, if the main cell material 2 to be etched is iridium, the hard material 14 may be, for example, aluminium oxide ($Al_2O_3$), titanium or titanium dioxide as these materials will etch very slowly in the processes to open the TEOS hard mask and the RIE of the main cell material.

If the main cell material 2 to be etched is PZT, silicon rich oxide (SRO) is preferably used as the hard material 14.

Figure 3B:
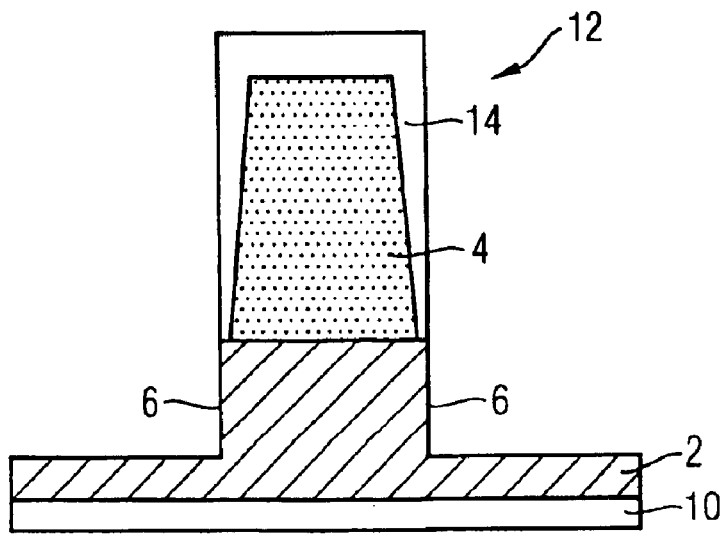
FIG. 3b is a schematic cross-section of an FeRAM according to an embodiment of the invention during main etching.

For two-stage etching, that is, etching two materials from the same mask in separate stages instead of etching through two different materials in a single process, the hard material 14 used can be changed between stages to achieve the optimum result FIG. 3b shows the device 12 of FIG. 3a during etching of the main cell material 2. The hard mask shape does not change during this process as it is protected by the hard material layer 14 so the side faces 6 of the etched main cell material 2 defining the apertures 8 created by the etching process remain substantially normal to the substrate 10.

Figure 4:
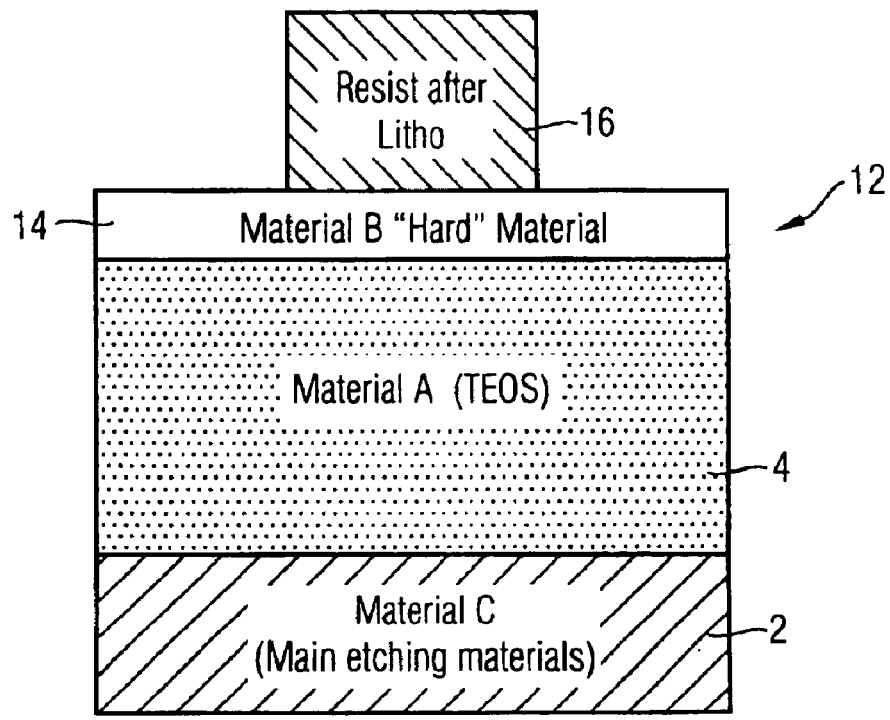
FIG. 4 is a schematic cross-section of an FeRAM according to an embodiment of the invention before hard mask opening.
Figure 5:
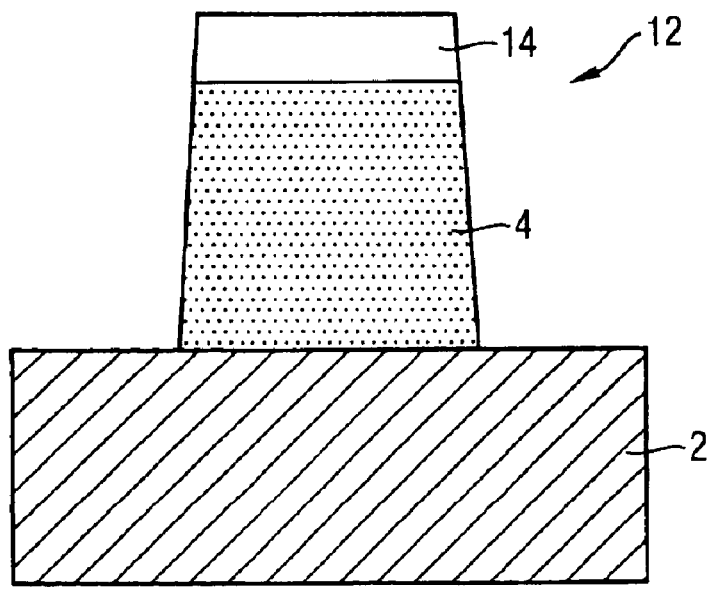
FIG. 5 is a schematic cross-section of an FeRAM according to an embodiment of the invention after hard mask opening.
Figure 6:
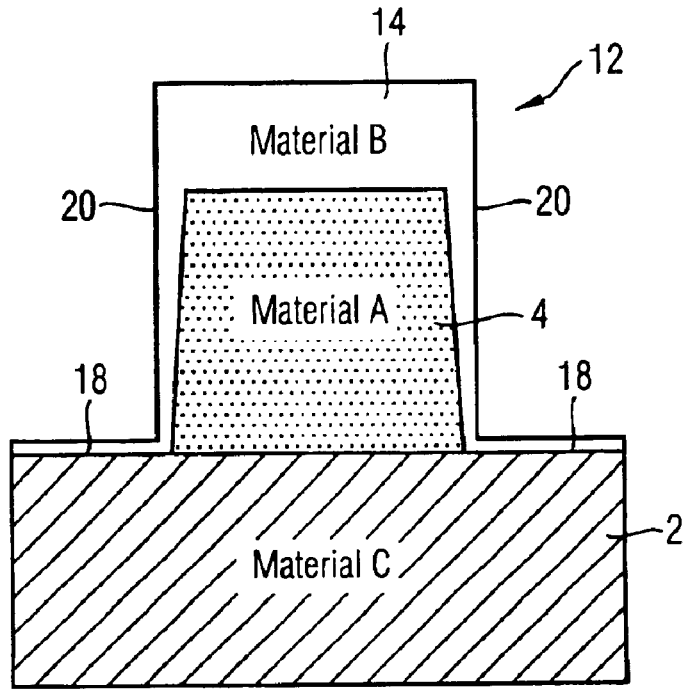
FIG. 6 is a schematic cross-section of the FeRAM of FIG. 5 with an additional hard material deposit over the hard mask before main etching.

FIGS. 4 to 6 show how to form the hard material layer 14 according to a first preferred embodiment.

FIG. 4 shows the device 12 of FIGS. 3a and 3b before etching of the hard mask material 4. The hard mask material 4, which may be TEOS, is deposited on the main cell materials 2 and a layer of the hard material 14 is deposited on top of the hard mask material 4. A layer of photoresist 16 is deposited on the layer of hard material 14. The layer of photoresist 16 is then exposed and developed to produce a lithographic pattern for the hard mask 4.

FIG. 5 shows the device 12 of FIG. 4 after etching of the hard material layer 14 and the hard mask material 4 down to the main cell materials 2 to open the hard mask 4.

FIG. 6 shows the device 12 of FIG. 5 after an additional layer of hard material 14 is deposited over the etched original layer of hard material, the etched hard mask material 4 and the exposed surfaces 18 of the main cell material 2. As the thickness of the hard material layer 14 (which includes the remnants of the original hard material layer and the additional hard material layer) is greater furthest from the main cell materials 2 than the thickness of the hard material layer closest to the main cell materials 2, so the side walls 20 of the hard material layer 14 may be formed substantially normal to the upper surface of the main cell materials 2. The portions of hard material layer 14 deposited on the exposed surfaces 18 of the main cell materials 2 may be removed during etching of the main cell materials.

If the photoresist material 16 is not compatible with the hard material 14 thereby inhibiting proper patterning procedures, or if the material used for the photoresist material will not withstand the etching process used for the hard material 14, an additional layer 22 of hard mask material, such as TEOS, may be deposited on the upper surface of the hard material layer 14 and the photoresist 16 may then be applied over the additional hard mask material layer 22. This is shown in FIGS. 7 to 10.

Figure 7:
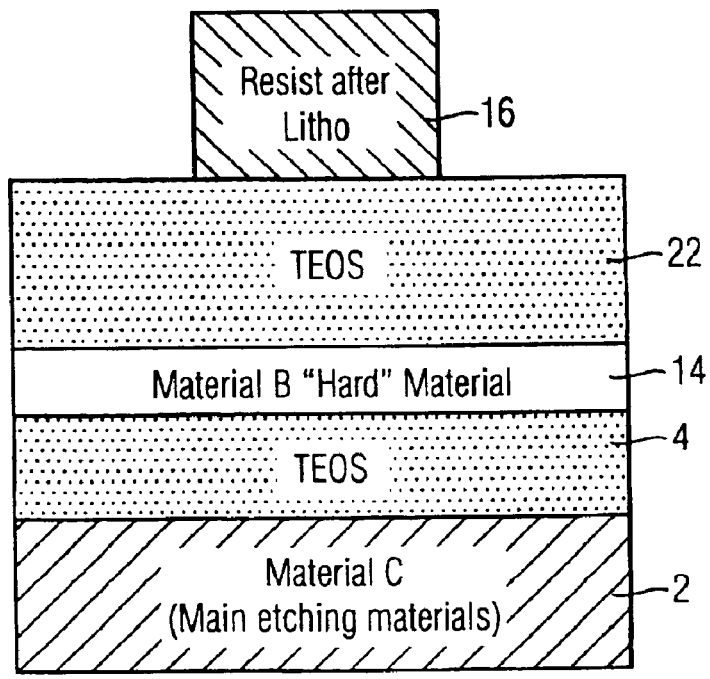
FIG. 7 is a schematic cross-section of an F RAM according to a further embodiment of the invention with an additional layer of material placed between a layer of hard material and the photomask used to define the hard mask.

FIG. 7 shows the additional layer 22 of hard mask material applied to the upper surface of the hard material layer 14 and the photoresist 16 applied over the additional hard mask material layer 22 after the photoresist 16 has been exposed and developed to produce a lithographic pattern for the hard mask 4 but before etching of the hard mask 4.

Figure 8:
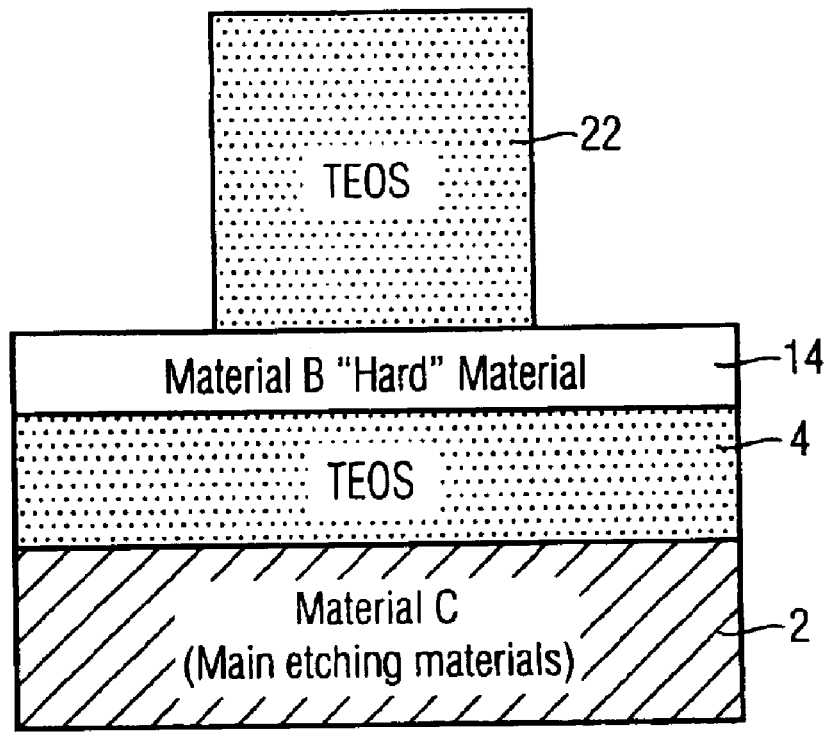
FIG. 8 is a schematic cross-section of the FeRAM of FIG. 7 after etching the additional layer down to the hard material to form a mask for the hard mask.

FIG. 8 shows the device of FIG. 7 after the first etch of the hard mask material 4 to produce the mask for etching the hard material layer 14.

Figure 9:
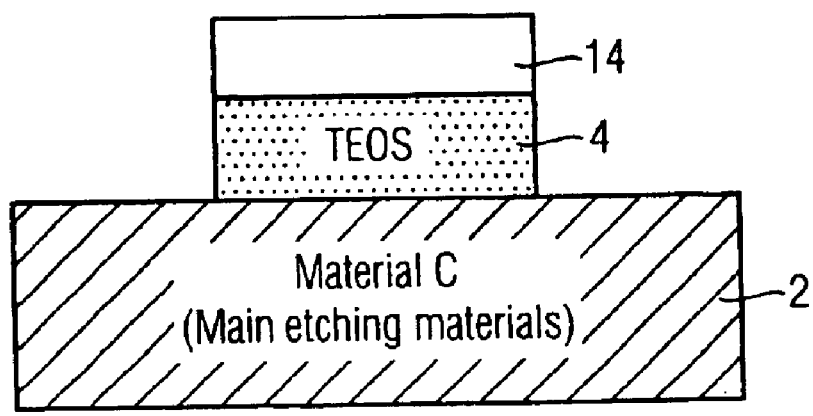
FIG. 9 is a schematic cross-section of the FeRAM of FIG. 8 after etching to shape the hard mask.

FIG. 9 shows the device of FIG. 8 after etching the hard material layer 14 and the hard mask material 4 down to the main cell materials 2.

Figure 10:
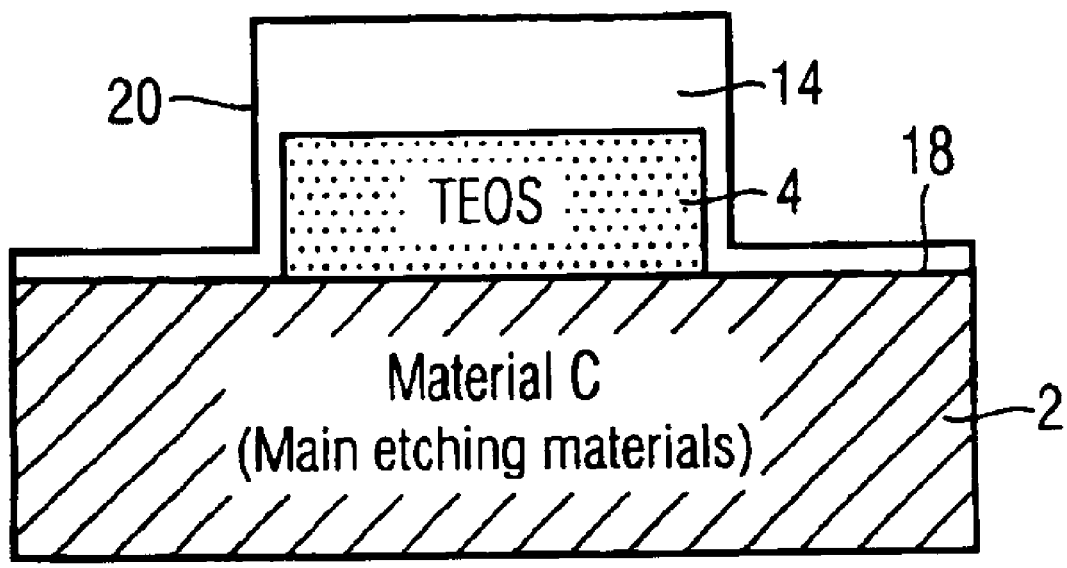
FIG. 10 is a schematic cross-section of the FeRAM of FIG. 9 with an additional deposit of hard material.

FIG. 10 shows the device of FIG. 9 with an additional layer of hard material 14 deposited over the etched original layer of hard material, the etched hard mask material 4 and the exposed surfaces 18 of the main cell material 2 to straighten the sides of the device in preparation for etching of the main cell materials 2. As the thickness of the hard material layer 14 (which includes the remnants of the original hard material layer and the additional hard material layer) is greater furthest from the main cell materials 2 than the thickness of the hard material layer closest to the main cell materials 2, so the side walls 20 of the hard material layer 14 may be formed substantially normal to the upper surface of the main cell materials 2. The portions of hard material layer 14 deposited on the exposed surfaces 18 of the main cell materials 2 may be removed during etching of the main cell materials.

It will be noted that the terms photoresist and photolithographic layer have been used interchangeably in the specification.

The systems and methods according to the present invention may be particularly useful in the production of devices for use, for example, as ferroelectric random access memories.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

What is claimed is:

1. A method for forming a ferroelectric capacitor device comprising the steps of:
   forming a substrate extending in a first plane and comprising a number of layers of material;
   forming a hard mask layer on said substrate;
   forming a first layer of a first material on said hard mask layer;
   etching said first layer of first material and said hard mask layer to define a hard mask shape;
   depositing a second layer of said first material over said etched first layer of first material and said etched hard mask layer to enclose said hard mask shape, said deposited second layer having side surfaces extending substantially perpendicular to said plane of said substrate thereby providing a masking structure having sidewalls which are less tapered than the sidewalls of the hard mask shape; and
   shaping said ferroelectric capacitor device by etching said second layer and said number of layers forming said substrate.

2. A method according to claim 1, wherein the step of forming said first layer of said first material on said hard mask layer comprises forming said first layer of a material which has a slow etch rate compared to said hard mask layer material.

3. A method according to claim 1, wherein the step of forming a first layer of a first material on said hard mask layer comprise forming said first layer of aluminium oxide ($Al_2O_3$).

4. A method according to claim 1, wherein the step of forming a first layer of a first material on said hard mask layer comprises forming said first layer of titanium.

5. A method according to claim 1, wherein the step of forming a first layer of a first material on said hard mask layer comprises forming said first layer of titanium dioxide ($TiO_2$).

6. A method according to claim 1, wherein the step of forming a first layer of a first material on said hard mask layer comprises forming said first layer of silicon rich oxide (SRO).

7. A method according to claim 1, wherein the step of forming a hard mask layer on said substrate comprises forming said bard mask layer of TEOS.

8. A method according to claim 1, wherein the step of forming said substrate comprises forming one or more of said number of layers of iridium.

9. A method according to claim 1, wherein the step of forming said substrate comprises forming one or more of said number of layers of PZT.

10. A method according to claim 1, wherein the step of defining the hard mask shape by etching said first layer of first material and said hard mask layer comprises applying a photolithographic layer to said first layer of first material, exposing said photolithographic layer; and developing said exposed photolithographic layer to produce an etch pattern for said first layer of first material and said hard mask layer.

11. A method according to claim 1, wherein the step of etching said second layer and said number of layers forming said substrate to shape said ferroelectric capacitor device comprises applying an RIB process.

12. A method according to claim 1, further comprising forming a second layer of hard mask material on said first layer of said first material prior to the step of defining said hard mask shape.

13. A method according to claim 12, wherein the step of defining said hard mask shape comprises etching said second layer of hard mask material to provide an etch pattern for said first layer of hard mask material.

* * * * *